(12) United States Patent
Demange et al.

(10) Patent No.: US 6,980,458 B2
(45) Date of Patent: Dec. 27, 2005

(54) SENSING CIRCUIT FOR FERROELECTRIC NON-VOLATILE MEMORIES

(75) Inventors: Nicolas Demange, Lessy (FR); Salvatore Torrisi, Catania (IT); Giampiero Sberno, Catania (IT)

(73) Assignee: STMicroelectronics, S.r.l., (IT)

( * ) Notice: Subject to any disclaimer, the term of this patent is extended or adjusted under 35 U.S.C. 154(b) by 0 days.

(21) Appl. No.: 10/274,288

(22) Filed: Oct. 18, 2002

(65) Prior Publication Data
US 2003/0090925 A1    May 15, 2003

(30) Foreign Application Priority Data
Oct. 18, 2001  (EP)  .................................. 01830656

(51) Int. Cl.⁷ ............................................. G11C 11/22
(52) U.S. Cl. .................. 365/145; 365/185.21
(58) Field of Search ........................... 365/185.21, 145

(56) References Cited

U.S. PATENT DOCUMENTS

| | | | | |
|---|---|---|---|---|
| 5,055,763 A | * | 10/1991 | Johnson et al. ............. 320/125 |
| 5,270,967 A | * | 12/1993 | Moazzami et al. .......... 365/145 |
| 5,274,583 A | | 12/1993 | Rapp ........................... 364/829 |
| 5,381,379 A | * | 1/1995 | Fukumoto ................. 365/238.5 |
| 5,418,389 A | * | 5/1995 | Watanabe ................... 257/295 |
| 5,579,257 A | * | 11/1996 | Tai .............................. 365/145 |
| 5,687,352 A | * | 11/1997 | Beat ........................... 711/154 |
| 5,835,400 A | * | 11/1998 | Jeon et al. ................... 365/145 |
| 5,909,394 A | | 6/1999 | Chou ..................... 365/185.21 |
| 6,128,239 A | | 10/2000 | Perner ......................... 365/209 |
| 6,198,681 B1 | * | 3/2001 | Forbes ........................ 365/205 |
| 6,256,247 B1 | | 7/2001 | Perner ......................... 365/209 |
| 6,788,563 B2 | * | 9/2004 | Thompson et al. ......... 365/145 |

FOREIGN PATENT DOCUMENTS

EP        01 83 0656        5/2002

* cited by examiner

Primary Examiner—Michael Tran
(74) Attorney, Agent, or Firm—Lisa K. Jorgenson; P. G. Scott Born; Graybeal Jackson Haley LLP

(57) ABSTRACT

A circuit for sensing a ferroelectric non-volatile information storage unit comprises a pre-charge circuit for applying a prescribed pre-charge voltage to a storage capacitor of the information storage unit. The pre-charge voltage causes a variation in a polarization charge of the storage capacitor, depending on an initial polarization state of the storage capacitor. A charge integration circuit integrates an electric charge proportional to the variation in polarization charge experienced by the storage capacitor. The charge integration circuit thus provides an output voltage depending on the polarization state of the storage capacitor. The charge integration circuit may comprises an integration capacitor and current mirror circuit, with a first mirror branch coupled to the pre-charge circuit and a second mirror branch coupled to the integration capacitor, for mirroring into the second mirror branch an electric charge supplied to the information storage unit to compensate for the variation in the polarization charge experienced by the storage capacitor.

28 Claims, 3 Drawing Sheets

SENSING CIRCUIT FOR FERROELECTRIC NON-VOLATILE MEMORIES

CROSS-REFERENCE TO RELATED APPLICATIONS

The present application claims priority from European patent application no. 01830656.3, filed Oct. 18, 2001, presently pending.

TECHNICAL FIELD

The present invention concerns a sensing circuit for ferroelectric non-volatile memories, particularly adapted to memories of large size.

BACKGROUND

A ferroelectric non-volatile memory cell consists of a select, or access, transistor and a storage capacitor whose dielectric is a ferroelectric material film. By applying an electric field of sufficient strength across the storage capacitor, the ferroelectric material is polarized in the direction of the electric field, and the acquired polarization is retained after the electric field is removed. If an electric field of sufficient strength and direction opposite to the polarization direction is subsequently applied, the ferroelectric material becomes and remains polarized in such an opposite direction even after the electric field is removed. The effect of the polarization is a non-zero charge per unit storage capacitor area that exists even when no voltage is applied across the capacitor and does not disappear in time. Information can thus be stored in the memory cell by associating the two opposite directions of polarization of the storage capacitor ferroelectric material with the two logic states "1" and "0".

Due to the similarity of the ferroelectric non-volatile memory cell with the dynamic RAM (DRAM) memory cell, the former is also referred to as ferroelectric RAM or FeRAM.

Two families of FeRAMs are known in the art, which differ from each other by the number of memory cells employed to store a single data bit.

FeRAMs of a first family use a single memory cell as a bit storage unit, and are for this reason also referred to as "1T1C" (one transistor, one capacitor). Thanks to the simplicity of the bit storage unit, this kind of approach is suitable for achieving very large memory sizes, on the order of megabits.

A "1T1C" FeRAM cell read process involves a sharing of the charge of the memory cell storage capacitor with the parasitic capacitance of the respective bit line. A voltage thus develops on the bit line which, through the respective select transistor, is electrically connected to the storage capacitor. The bit line voltage can take one of two different values, depending on the polarization of the storage capacitor. A sense amplifier, typically a comparator fed with the bit line voltage and with a reference voltage, discriminates between the two possible voltage values and provides the stored data bit by comparing the bit line voltage to the reference voltage.

A problem with the "1T1C" approach are the difficulties inherent in the generation of the reference voltage to be supplied to the sense amplifier. The reference voltage typically must be sufficiently accurate for discriminating between the two voltage values which can develop on the bit line. In particular, the difficulties arise from the fact that the reference voltage must assure the possibility of discriminating between the two voltage values in any condition of temperature, supply voltage, process variations and storage capacitor degradation within the specified ratings. In order to comply with these requirements, complex circuitry must be provided for, which has a negative impact on the memory chip size. Another problem affecting the "1T1C" approach is that the read margin, i.e. the difference between the two possible voltage values that develop on the bit line, decreases as the bit line length increases, due to the increase in the bit line parasitic capacitance.

A second family of FeRAMs has bit storage units made up of two memory cells, and is for this reason referred to as "2T2C" (two transistors, two capacitors). Considering a generic bit storage unit, the two storage capacitors are at any time polarized in mutually opposite directions (i.e., they store opposite logic states), except during the read and write operations. In order to read the data bit stored in a bit storage unit, a same electric field is applied across both the capacitors; as a result, the polarization of one capacitor is simply confirmed, while that of the other capacitor is reversed. The change in polarization of the capacitor results in a charge on the bit line which, through the respective select transistor, is electrically connected to the storage capacitor. The sense amplifier is typically made up of two CMOS inverters connected in a latch configuration to both the bit lines; by choosing a convention for the connection of the sense amplifier inputs to the two bit lines, one pair of mutually opposite polarization states of the capacitors is interpreted as a logic "1", while the other pair of mutually opposite polarization states is interpreted as a logic "0".

This bit storage unit architecture does not suffer of the problems of the "1T1C" one, since no reference levels are needed for sensing the bit storage unit. For this reason, this architecture is also referred to as self-referenced. However, the "2T2C" architecture is not suitable for large size memories, because the array of bit storage units contains twice the number of memory cells as the "1T1C" one.

SUMMARY

In view of the state of the art described, an embodiment of the present invention provides a sensing circuit adapted to be used in the sensing of both "1T1C" and "2T2C" ferroelectric non-volatile information storage units, and which is not affected by the problems mentioned above.

In brief, a sensing circuit according to an embodiment of the invention comprises a pre-charge circuit for applying a prescribed pre-charge voltage to a storage capacitor of the information storage unit. The pre-charge voltage causes a variation in a polarization charge of the storage capacitor, depending on a polarization state of the storage capacitor.

A charge integration circuit is also provided for integrating an electric charge proportional to the variation in polarization charge experienced by the storage capacitor. The charge integration circuit thus provides an output voltage depending on the polarization state of the storage capacitor.

BRIEF DESCRIPTION OF THE DRAWINGS

The features and advantages of the present invention will be made apparent by the following detailed description of some embodiments thereof, provided merely by way of non-limitative example, which will be made referring to the annexed drawings, wherein.

DETAILED DESCRIPTION

Figure 1:
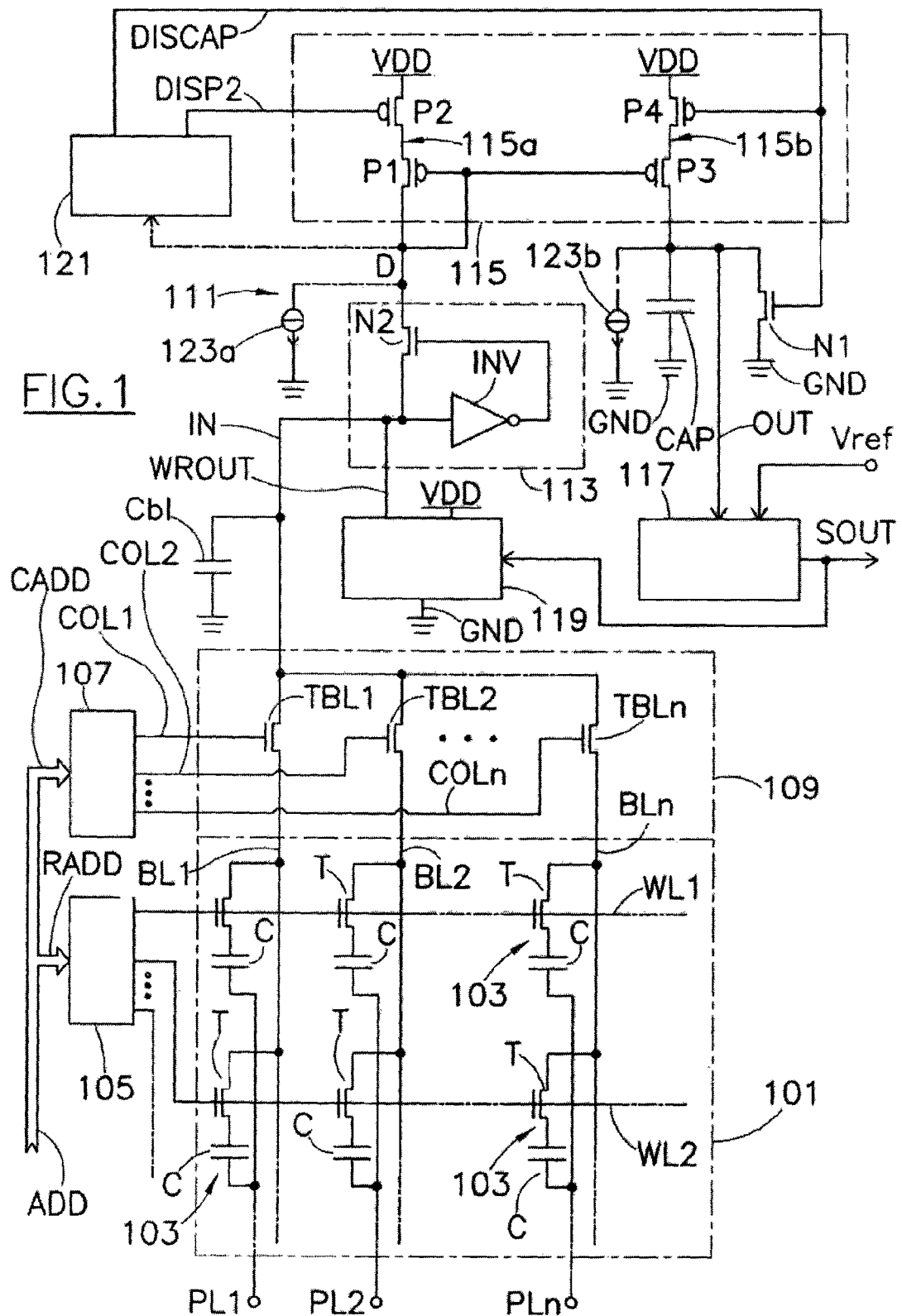
FIG. 1 is a schematic diagram of a sensing circuit according to an embodiment of the present invention.

Referring to FIG. 1, an array of non-volatile ferroelectric elemental information storage units of a memory device is schematically depicted. The array, identified in the drawings by 101, comprises a plurality of elemental information storage units 103 arranged in a plurality of rows and a plurality of columns. Each elemental information storage unit 103 is connected to a respective word line of a plurality of word lines of the array 101; all the elemental information storage units 103 connected to a same word line form a row of the array 101. In the drawing, only two word lines WL1 and WL2, and thus only two rows of the array 101, are shown for simplicity. Also, each elemental information storage unit 103 is connected to a respective bit line of a plurality of bit lines of the array 101; the elemental information storage units 103 connected to a same bit line form altogether a column of the array 101. In the drawing, only three bit lines BL1, BL2 and BLn, and thus only three columns, are shown for simplicity. These three bit lines are to be intended as representing a packet of n bit lines; such a packet groups together the elemental storage units associated with one bit of an output data byte or word of the memory device.

In the shown example, the elemental information storage units are of the "1T1C" type. Each elemental information storage units includes a select, or access, transistor T and a ferroelectric storage capacitor C. The storage capacitor has a capacitor dielectric formed of a ferroelectric material. The select transistor T is for example an N channel MOSFET having a drain connected to the respective bit line, a source connected to a first plate of the storage capacitor C and a gate connected to the respective word line. Concerning the second plate of the storage capacitors C, a known memory architecture calls for having the second plates of all the storage capacitors of a column connected to a same respective plate biasing line PL1, PL2, . . . , PLn, distinct from the plate biasing lines to which the second plates of the storage capacitors belonging to the other columns are connected.

Also schematically shown in FIG. 1 are a word line address decoder and selector 105, a bit line address decoder 107 and a bit line selector 109.

The word line address decoder and selector 105 receives word line, or row, address signals RADD from an address signal bus ADD. The word line address decoder and selector 105 decodes a binary code carried by the row address signals RADD and accordingly selects one row among the plurality of rows of the array, by applying a prescribed word line select voltage to the corresponding word line. Typically, the voltage applied to the selected word line is the supply voltage VDD of the memory device; the remaining, non-selected word lines are kept to the reference voltage GND (ground) of the memory device. In some cases, it may be desirable that the voltage applied to the selected word line be higher than the memory device supply voltage VDD, for example to speed up the sensing operation; in this cases, a voltage booster may be provided for in the memory device. By applying the word line selection voltage, the select transistors T of all the information storage units belonging to the selected word line are turned on.

The bit line address decoder 107 receives bit line, or column, address signals CADD from the address signal bus ADD. The bit line address decoder 107 decodes a binary code carried by the column address signals CADD and accordingly asserts one of a plurality of n bit line select signals COL1, COL2, . . . , COLn. The bit line select signals COL1, COL2, . . . , COLn are supplied to the bit line selector 109. The bit line selector 109, or bit line multiplexer, comprises a plurality of n bit line select transistors TBL1, TBL2, . . . , TBLn, each one connected in series by the source thereof to a respective bit line BL1, BL2, . . . , BLn. Each bit line select signal COL1, COL2, . . . , COLn is connected to the gate of a respective bit line select transistor TBL1, TBL2, . . . , TBLn. The asserted bit line select signal is raised to the supply voltage VDD while the remaining, non-asserted bit line select signals are kept to the ground GND. Alternatively, the asserted bit line select signal may be raised to a voltage higher than the memory device supply voltage VDD, generated by a voltage booster. The assertion of a bit line select signal causes the associated bit line select transistor to turn on, while all the remaining bit line select transistors are kept in the off state.

The selection of one word line operated by the word line address decoder and selector 105 according to the binary code carried by the row address signals RADD, and the selection of one bit line operated by the bit line address decoder 107 and the bit line selector 109 according to the binary code carried by the column address signals CADD determine the selection of one information storage unit 103 among all the information storage units belonging to the packet of n bit lines.

The drains of the bit line select transistors TBL1, TBL2, . . . , TBLn are commonly connected to an input line IN of a sensing circuit or sense amplifier identified globally by 111. The sense amplifier 111 comprises several building blocks, specifically a pre-charge circuit 113, a current mirror circuit 115, an integration capacitor CAP, a clamp element N1, a read evaluation circuit 117 and a write/restore circuit 119.

The pre-charge circuit 113 comprises an N-channel MOSFET N2 having the source connected to the sense amplifier input line IN and the gate connected to an output of an inverter INV, for example of the CMOS type, whose input is connected to the input line IN and thus to the source of the transistor N2. The MOSFET N2 of the pre-charge circuit and the select transistor T of the selected information storage unit 103 form a cascode circuit configuration.

Alternatively, the inverter INV may be substituted for by a bias voltage generator for generating a bias voltage to be supplied to the gate of the N-channel MOSFET N2, or even by a feedback network comprising an operational amplifier with a first input coupled to the source of the N-channel MOSFET N2, a second input supplied with a reference voltage and an output connected to the gate of the N-channel MOSFET N2.

The current mirror circuit 115 comprises two circuit branches 115a, 115b. A first circuit branch 115a is connected to the pre-charge circuit 113, and comprises a first P-channel MOSFET P1 and a second P-channel MOSFET P2 connected in series to each other. The first P-channel MOSFET P1 is connected in diode configuration and has the drain connected to the drain (circuit node D indicated in the drawings) of the N-channel MOSFET N2 of the pre-charge circuit 113. The second P-channel MOSFET P2 has the drain connected to the source of the first P-channel MOSFET P1, the source connected to the voltage supply VDD and the gate connected to a first control signal DISP2, generated under the control of a control and timing circuitry of the memory device (shown schematically as a block 121 in the drawings), having the function of enabling and disabling the second P-channel MOSFET P2 The second circuit branch 115*b* of the current mirror circuit 115 comprises, similarly to the first circuit branch 115*a*, a third P-channel MOSFET P3 and a fourth P-channel MOSFET P4 connected in series to each other. The third P-channel MOSFET P3 has the gate connected to the gate of the first P-channel MOSFET P1, the drain connected to a first plate of the integration capacitor CAP and the source connected to the drain of the fourth P-channel MOSFET P4. This latter transistor has the source connected to the voltage supply VDD and the gate connected to a second control signal DISCAP, also generated under the control of the control and timing circuitry 121, having the function of enabling and disabling the fourth P-channel MOSFET P4.

The first and the third P-channel MOSFETs P1 and P3 are the current mirroring elements of the current mirror circuit 115, while the second and the fourth P-channel MOSFETs P2 and P4 are enabling elements for selectively enabling the two branches 115*a*, 115*b* of the current mirror circuit 115.

The first and the third P-channel MOSFETs P1 and P3 may be dimensioned in such a way to have same aspect ratios, corresponding to a mirroring ratio equal to one, or they may have different dimensions, so to vary the mirroring ratio.

For a better performance, the current mirror 115 may be provided with a bias circuit having the function of keeping the current mirror always biased at a prescribed working point. Referring to FIG. 1, the bias circuit is schematically depicted (in dash-and-dot line) as implemented by two current generators 123*a*, 123*b*, sinking a small current from the circuit node D and, for symmetry, from the node corresponding to an output line OUT of the current mirror 115.

It is worth noting that the current mirror circuit may be formed by different transistors, may have more than two circuit branches or may have a different structure.

The clamp element N1 is for example an N-channel MOSFET, having the drain connected to the first plate of the integration capacitor CAP, the source connected to the ground GND and the gate connected to the second control signal DISCAP. The second plate of the integration capacitor CAP is connected to the ground GND.

The drain of the third P-channel MOSFET P3, i.e. the circuit node to which the first plate of the integration capacitor CAP is connected, forms a current mirror output line OUT which is fed to the read evaluation circuit 117. This latter comprises for example a voltage comparator connected at one input thereof to the current mirror output line OUT, the other input receiving a reference voltage Vref, generated in any one of the conventional ways, for example by means of a reference information storage unit. An output line SOUT of the read evaluation circuit provides a binary logic state corresponding to the information stored in the sensed information storage unit 103.

The write/restore circuit 119, which receives the output line SOUT, has a respective output line WROUT connected to the input line IN of the sense amplifier, and behaves as a tristate buffer, selectively driving the output line WROUT into a high-impedance condition during the initial phases of a read operation, or to the voltage supply VDD or to the ground GND during a restore phase of the read operation, as will be explained later on.

Figure 2:
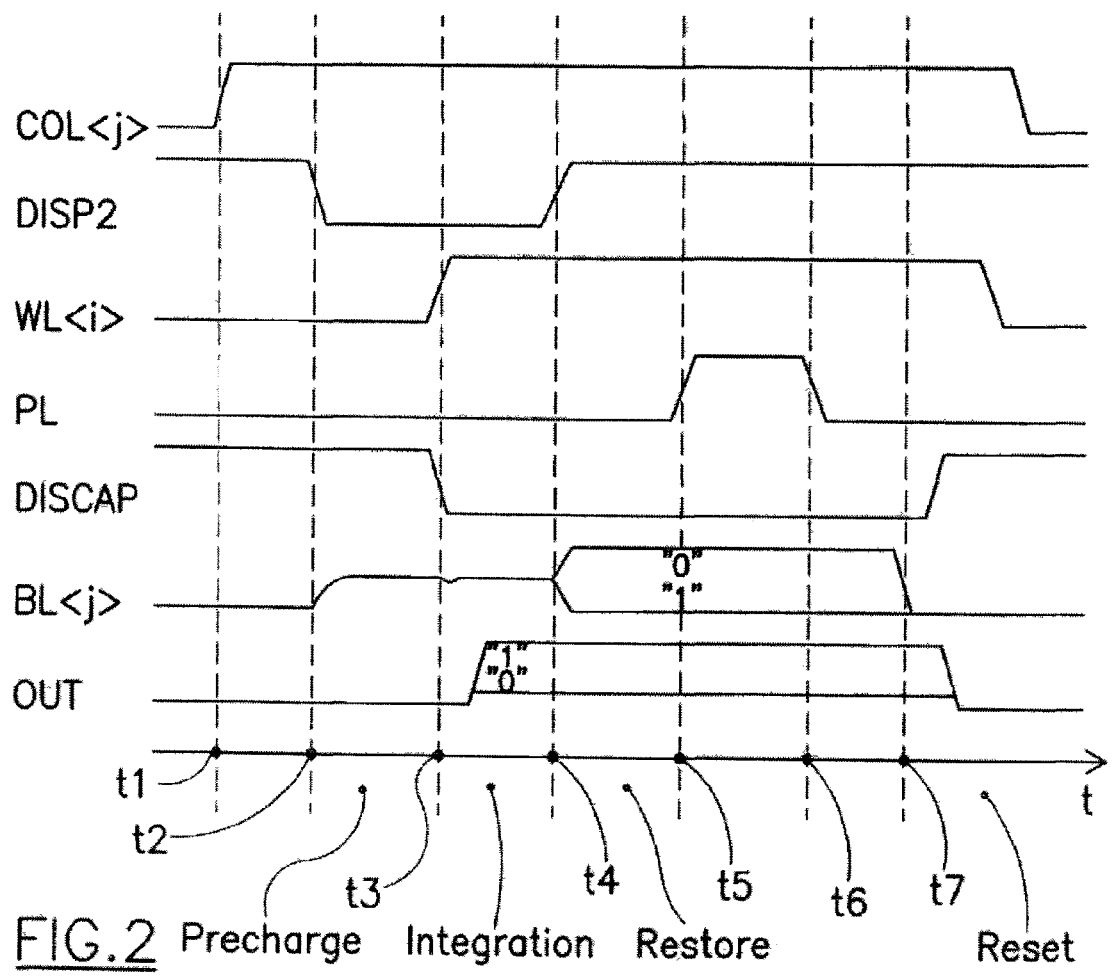
FIG. 2 is a time diagram showing the timing of control signals shown in FIG. 1.

The operation of the sense amplifier will be now described in detail making reference to the timing diagram of a read operation shown in FIG. 2.

Let it be assumed that the information storage unit belonging to the i-th word line WL<i> and the j-th bit line BL<j> is to be accessed. At the time instant t1 the bit line address decoder 107 asserts the column selection signal COL<j> corresponding to the bit line BL<j>; this causes the bit line select transistor associated with the bit line BL<j> to turn on while all the remaining bit line select transistors are kept off, so that the bit line BL<j> is connected to the input line IN of the sense amplifier 111. During the initial phases of the read operation the first and second control signals DISP2 and DISCAP are de-asserted, a condition corresponding to a voltage level equal to the supply voltage VDD on these signals; consequently, the second and fourth P-channel MOSFETs P2 and P4 are off. Also, during the initial phases of the read operation the plate signal PL<j>, and thus the second plates of the storage capacitors C belonging to the bit line BL<j>, are kept to ground.

At the time instant t2 a pre-charge phase starts. The first control signal DISP2 is asserted, and the voltage level thereof is brought to the ground GND. This causes the second P-channel MOSFET P2 in the first branch 115*a* of the current mirror circuit 115 to turn on. The potential of the selected bit line BL<j>, initially in a reset state corresponding to a voltage level substantially equal to the ground GND, starts to rise towards the supply voltage VDD. The rise of the bit line potential corresponds to the charging of a bit line parasitic capacitance Cbl by means of the current supplied by the first branch 115*a* of the current mirror circuit 115 and controlled by the pre-charge circuit 113. The bit line potential tends asymptotically to a pre-charge voltage Vprch set by the pre-charge circuit 113. The pre-charge voltage Vprch depends on the dimensions and on the electrical characteristics (e.g., threshold voltages) of the N-channel MOSFET N2 and of the MOSFETs of the CMOS inverter INV, and on the supply voltage of the inverter INV. For example, the pre-charge voltage Vprch may range from 1 V to 1.5 V.

During the pre-charge phase the second control signal DISCAP is kept de-asserted, so that the current mirror output line OUT is kept to the ground GND by the clamp transistor N1. The pre-charge phase ends at the time instant t3, the time lapse from the time instant t2 being chosen in such a way as to ensure that the bit line voltage has approximately reached the pre-charge voltage Vprch.

The next phase of the read operation is the integration phase. At the time instant t3 the word line WL<i> is selected and the voltage thereof is raised to the word line select voltage, for example equal to the supply voltage VDD or to a higher voltage derived from the supply voltage VDD by means of a voltage booster; as a consequence, the select transistors T of the information storage units connected to the word line WL<i> are all turned on, but only the storage capacitor C of that information storage unit belonging to the selected bit line BL<j> is connected to first branch 115*a* of the current mirror circuit 115. Since the storage capacitor C of the selected information storage unit has the second plate at the ground GND, a voltage drop equal to the pre-charge voltage Vprch is applied to such a capacitor. Additionally, at the time instant t3 the second control signal DISCAP is asserted, thus enabling the fourth P-channel MOSFET P4 and turning the clamp transistor N1 off.

The transition from the pre-charge phase to the integration phase, characterized by the assertion of the second control signal DISCAP, is controlled by the timing and control circuitry 121. Such a transition may be governed by a time base internal to the timing and control circuitry 121, or it can be determined by monitoring the potential of the circuit node D.

Figure 3:
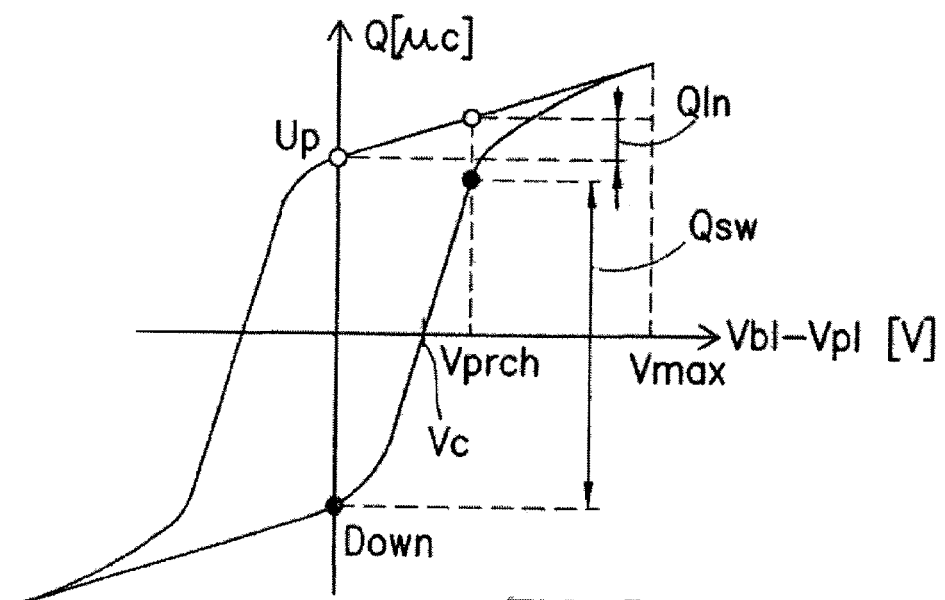
FIG. 3 is a diagram showing a hysteresis loop of a ferroelectric storage capacitor of a generic information storage unit shown in FIG. 1.

Reference is now made to FIG. 3, showing in diagrammatic form the hysteresis loop of the ferroelectric material constituting the storage capacitor C dielectric. In the diagram, the abscissa represents the voltage drop (in Volts) across the storage capacitor, equal to the bit line voltage Vbl minus the capacitor second plate voltage Vpl; the ordinate represents the electric charge Q (in $\mu$C) present in the storage capacitor. If the ferroelectric material is in the "down" state (the dot identified as Down in the diagram), the voltage drop Vprch applied to the storage capacitor tends to switch the ferroelectric dipoles. The switching charge Qsw which must be supplied to the storage capacitor to switch the ferroelectric dipoles comes through the bit line BL<j>, being supplied by the first branch 115a of the current mirror circuit 115. The switching charge Qsw is seen as a drop on the potential of the bit line BL<j>, whose amplitude depends on the amount of the switching charge Qsw, on the linear capacitance Cfe of the storage capacitor and on the parasitic capacitance Cbl associated with the bit line. If instead the ferroelectric material is in the "up" state (the dot identified as Up in the diagram), a charge partition takes place between the bit line parasitic capacitance Cbl and the storage capacitor linear capacitance Cfe. This charge partition causes an electric charge Qln to be sunk from the bit line capacitance by the storage capacitor linear capacitance; thus, also in this case a drop on the potential of the bit line BL<j> is observed. In particular, the pre-charge voltage Vprch is higher than a hysteresis loop coercitive voltage Vc (intersection of the hysteresis loop with the abscissa axis) but lower than a hysteresis loop maximum voltage Vmax.

In both cases, the pre-charge circuit 113, still enabled, tends to keep the potential of the bit line BL<j> to the pre-charge voltage Vprch, supplying exactly the amount of charge Qsw or Qln, depending on the state of the storage capacitor ferroelectric material. Since in the integration phase of the read operation the second branch 115b of the current mirror circuit 115 is enabled, the charge Qsw or Qln supplied by the first branch 115a is mirrored into the second branch 115b, and is integrated by the integration capacitor CAP. The charge integrated in the integration capacitor CAP is proportional to the charge supplied by the first branch 115a, with a proportionality factor depending on the mirror ratio of the current mirror circuit 115.

At the end of the integration phase, the voltage across the integration capacitor CAP, i.e. the voltage Vout at current mirror output line OUT, will take one of two possible values Voutsw, Voutln, depending on the two possible amounts of charge, proportional to Qsw and Qln, integrated by the integration capacitor CAP, where:

$$Voutsw=Qsw/CAP \text{ and } Voutln=Qln/CAP$$

having indicated by CAP the capacitance of the integration capacitor.

Preferably, the capacitance of the integration capacitor CAP should be chosen in such a way as to make the voltage value Voutsw approximately equal to the supply voltage VDD, and the voltage value Voutln as close as possible to the ground GND. In this way, a sufficiently high read margin (Voutsw−Voutln) is assured. By way of example only, assuming that the amount of charge Qsw is 150 fC, that of charge Qln is 30 fC and the supply voltage VDD is 3 V, by choosing a value of 50 fF for the integration capacitor CAP, the two possible output voltages Voutsw and Voutln are respectively equal to 3 V and 0.6 V, which assures a good read margin of 2.4 V.

The voltage Vout is supplied to the read evaluation circuit 117. Provided that the reference voltage Vref is midway between the two possible voltage values Voutsw, Voutln (which is not a major problem, thanks to the relatively high read margin), for example equal to half the supply voltage VDD value, the read evaluation circuit is able to discriminate between the two voltage Voutsw, Voutln. The logic state of the read evaluation circuit output SOUT depends on the voltage Vout being equal to Voutsw or Voutln.

At the end of the integration phase (time instant t4), the ferroelectric material of the storage capacitor C is always in the "up" state irrespective of its initial state. The integration phase is followed by a restore phase which provides for turning the pre-charge circuit 113 off, by de-asserting the first control signal DISP2. In order to restore the information stored in the accessed information storage unit, the sense amplifier input line IN, and thus the still selected bit line BL<j> are driven to the supply voltage VDD or to the ground GND by the restore circuit 119 (through the line WROUT), according to the logic state of the output SOUT of the read evaluation circuit. A voltage pulse equal to the supply voltage is applied to the plate line PL<j> (between time instants t5 and t6).

Eventually, the restore phase is followed by a reset phase, in which the potential of the selected bit line is brought to the ground GND. At the time instant t7 the restore circuit 119 drives the output line WROUT thereof to the ground, and the bit line capacitance is discharged. Then, the second control signal DISCAP is de-asserted, and also the integration capacitor CAP is discharged through the clamp transistor N1: the potential of the output line OUT of the current mirror is consequently brought to the ground. Finally, the word line WL<i> and the bit line BL<j> are de-selected.

A significant advantage of the sense amplifier according to this and other embodiments of the present invention resides in the fact that the electric charge deriving from the polarization charge change consequent to the access to a storage capacitor is not integrated in the bit line parasitic capacitance, but in a dedicated circuit capacitor, having a well-defined capacitance. The circuit capacitor, differently from the parasitic capacitance of the bit line, can be dimensioned in such a way as to ensure as high read signal.

Also, the read margin is independent from the parasitic capacitance Cbl of the bit line. The information stored in the information storage unit can thus be easily read, and there is no need to provide complex circuit solutions for generating the reference voltage Vref.

The sense amplifier according to this embodiment of the present invention is capable of assuring a quite high read margin even if the switching of the storage capacitor is partial (only a voltage equal to the pre-charge voltage Vprch is applied across the capacitor, instead of the full supply voltage VDD as in conventional sensing circuits). This reduces the fatigue to which the information storage unit is subjected during a read operation.

Additionally, thanks to the fact that the voltage of the current mirror output node OUT is independent from the bit line capacitance and the capacitance associated with the sense amplifier input line IN, the circuits performing the selection of the bit lines, in the example the bit line selector 109, do not introduce any disturbance between the selected bit line containing the information storage unit to be read and the reference structure generating the reference voltage Vref.

The pre-charge circuit of the sense amplifier can have a structure similar to the pre-charge circuits conventionally provided with in sense amplifiers for EPROMs, Flash EPROMs and EEPROMs. Thanks to this, any improvement devised for the pre-charge circuits used in these latter families of memory devices can typically be straightforwardly applied to the sense amplifier of this and other embodiments of the present invention.

Figure 4:
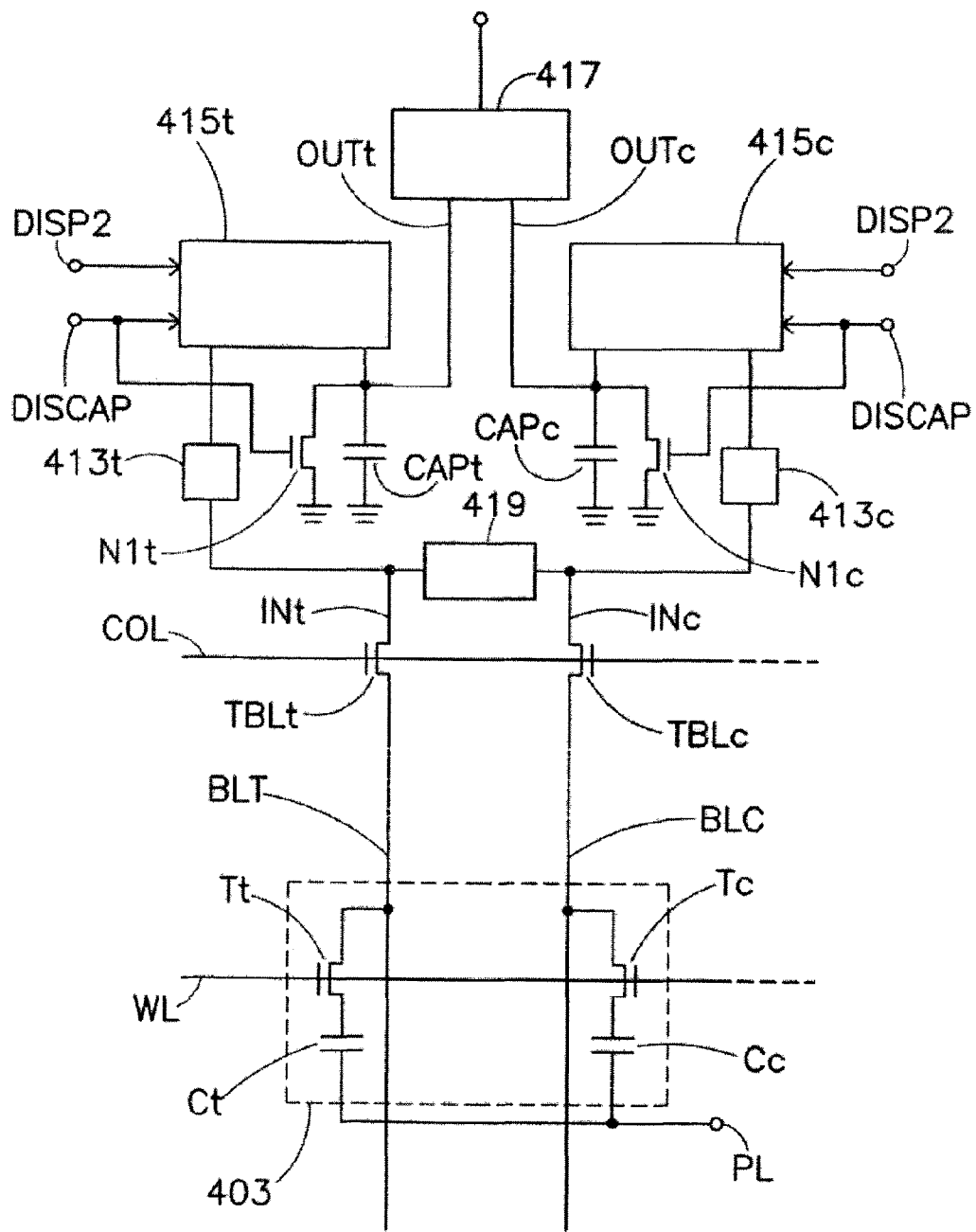
FIG. 4 is a schematic diagram of a sensing circuit according to another embodiment of the present invention.

Albeit the description provided so far has been referred to a "1T1C" information storage unit, this and other embodiments of the present invention can apply as well to "2T2C" information storage units. In this case, as schematically depicted in FIG. 4, each information storage unit 403 is made up of two memory cells, each one comprising a select transistor Tt, Tc in series to a storage capacitor Ct, Cc. Each column of the memory cell array is made up of two bit lines BLt, BLc, jointly selectable by means of respective bit line select transistors TBLt, TBLc. The bit line select transistors TBLt, TBLc allow one to connect the respective bit line to one of two input lines INt, INc of the sense amplifier. This latter comprises two pre-charge circuits 413t, 413c, two current-mirror circuits 415t, 415c, two integration capacitors CAPt, CAPc, and two clamp transistors N1t, N1c. Each current mirror circuit 415a, 415b has an output line OUTt, OUTc which feeds a read evaluation circuit 417, for example having the typical structure of a latch. A write/restore circuit 419 is provided for driving the two input lines INt, INc of the sense amplifier during the restore and reset phases of a read operation.

Although only two embodiments of the invention have been described, it is clear that those skilled in the art will be able to devise several modifications to the described embodiments, as well as other embodiments, without departing from the spirit and scope of the invention.

For example, the current mirror circuit may be replaced by any circuit capable of supplying to the integration capacitor an electric charge proportional to the charge supplied to the storage capacitor of the information storage unit for compensating the change in polarization charge thereof caused by the application of the pre-charge voltage.

The clamp element can be any circuit capable of switching between a low-impedance state and a high-impedance state.

The pre-charge circuit can be any circuit capable of supplying a current to the information storage unit in a controlled way, so as to keep the voltage applied across the storage capacitor at a prescribed value.

What is claimed is:

1. A circuit for sensing a ferroelectric non-volatile information storage unit, comprising:
   a pre-charge circuit for applying a prescribed pre-charge voltage to a storage capacitor of the information storage unit, the pre-charge voltage causing a variation in a polarization charge of the storage capacitor, said polarization charge variation depending on an initial polarization state of the storage capacitor, and
   a charge integration circuit for integrating an electric charge proportional to the polarization charge variation experienced by the storage capacitor, whereby the charge integration circuit provides an output voltage depending on the polarization state of the storage capacitor.

2. A circuit for sensing a ferroelectric non-volatile information storage unit, comprising:
   a pre-charge circuit for applying a prescribed pre-charge voltage to a storage capacitor of the information storage unit, the pre-charge voltage causing a variation in a polarization charge of the storage capacitor, said polarization charge variation depending on an initial polarization state of the storage capacitor, and
   a charge integration circuit for integrating an electric charge proportional to the polarization charge variation experienced by the storage capacitor, whereby the charge integration circuit provides an output voltage depending on the polarization state of the storage capacitor, wherein the charge intergration circuit comprises an intergration copacitor adapted to be charged to the output voltage.

3. The circuit according to claim 2, comprising a current mirror circuit including a first mirror branch coupled to the pre-charge circuit and a second mirror branch coupled to the integration capacitor, for mirroring into the second mirror branch an electric charge supplied to the information storage unit to compensate for the variation in the polarization charge experienced by the storage capacitor.

4. The circuit according to claim 3, in which the first mirror branch is selectively activatable for enabling the pre-charge circuit, and the second mirror branch is selectively activatable for enabling the charging up of the integration capacitor.

5. The circuit according to claim 3, in which the integration capacitor has a capacitance such that a first value of the voltage developed across the integration capacitor, corresponding to a first polarization state of the storage capacitor, is approximately equal to a supply voltage of the current mirror circuit, while a second value of the voltage developed across the integration capacitor, corresponding to a second polarization state of the storage capacitor, is close to a reference voltage.

6. A circuit for sensing a ferroelectric non-volatile information storage unit, comprising:
   a pre-charge circuit for applying a prescribed pre-charge voltage to a storage capacitor of the information storage unit, the pre-charge voltage causing a variation in a polarization charge of the storage capacitor, said polarization charge variation depending on an initial polarization state of the storage capacitor, wherein the pre-charge circuit comprises a cascode structure, and
   a charge integration circuit for integrating an electric charge proportional to the polarization charge variation experienced by the storage capacitor, whereby the charge integration circuit provides an output voltage depending on the polarization state of the storage capacitor.

7. The circuit according to claim 2, further comprising a read evaluation circuit receiving the voltage developed across the integration capacitor for determining the information stored in the information storage unit.

8. The circuit according to claim 7 for sensing a "1T1C" ferroelectric information storage unit, the read evaluation circuit determining the information stored in the information storage unit by comparing the voltage developed across the integration capacitor to a reference voltage.

9. The circuit according to claim 7 for sensing a "2T2C" ferroelectric information storage unit, comprising for each memory cell of the information storage unit a respective pre-charge circuit, and a respective integration capacitor, the read evaluation circuit determining the information stored in the information storage unit by comparing voltages developed across the integration capacitors.

10. A circuit for sensing a ferroelectric non-volatile information storage unit, comprising:
    a pre-charge circuit for applying a prescribed pre-charge voltage to a storage capacitor of the information storage unit, the pre-charge voltage causing a variation in a polarization charge of the storage capacitor, said polarization charge variation depending on an initial polarization state of the storage capacitor, wherein the pre-charge voltage is higher than a hysteresis loop coercitive voltage but lower than a hysteresis loop maximum voltage of the storage capacitor, and a charge integration circuit for integrating an electric charge proportional to the polarization charge variation experienced by the storage capacitor, whereby the charge integration circuit provides an output voltage depending on the polarization state of the storage capacitor.

11. A method for sensing a ferroelectric non-volatile information storage unit, comprising the steps of:

pre-charging a storage capacitor of the information storage unit to a pre-charge voltage causing a variation in a polarization charge of the storage capacitor depending on an initial polarization state thereof;

integrating an electric charge proportional to the variation in polarization charge experienced by the storage capacitor in a charge integration circuit, thereby providing an output voltage depending on the polarization state of the storage capacitor, and determining an information stored in the information storage unit on the basis of the output voltage.

12. A method for sensing a ferroelectric non-volatile information storage unit, comprising the steps of:

pre-charging a storage capacitor of the information storage unit to a pre-charge voltage causing a variation in a polarization charge of the storage capacitor depending on an initial polarization state thereof;

integrating an electric charge proportional to the variation in polarization charge experienced by the storage capacitor in a charge integration circuit, thereby providing an output voltage depending on the polarization state of the storage capacitor, said step of integrating the electric charge comprises charging an integration capacitor by a charge proportional to the variation in polarization charge, and determining an information stored in the information storage unit on the basis of the output voltage.

13. The method according to claim 12, in which said step of integrating comprises mirroring into the integration capacitor an electric charge supplied to the information storage unit to compensate for the variation in polarization charge.

14. A method for sensing a ferroelectric non-volatile information storage unit, comprising the steps of:

pre-charging a storage capacitor of the information storage unit to a pre-charge voltage causing a variation in a polarization charge of the storage capacitor depending on an initial polarization state thereof;

integrating an electric charge proportional to the variation in polarization charge experienced by the storage capacitor in a charge integration circuit, thereby providing an output voltage depending on the polarization state of the storage capacitor, determining an information stored in the information storage unit on the basis of the output voltage; and restoring the initial polarization state of the storage capacitor.

15. A read circuit for reading data from a storage unit, the read circuit comprising:

a charge circuit operable to provide an amount of charge to the storage unit;

an evaluation circuit operable to determine the value of the data from the amount of provided charge; and a measurement circuit operable to determine the amount of charge that the charge circuit provides to the storage unit.

16. A read circuit for reading data from a storage unit, the read circuit comprising:

a charge circuit operable to provide an amount of charge to the storage unit;

an evaluation circuit operable to determine the value of the data from the amount of provided charge; and an integrator operable to determine the amount of charge that the charge circuit provides to the storage unit.

17. A read circuit for reading data from a storage unit, the read circuit comprising:

a charge circuit operable to provide an amount of charge to the storage unit; and an evaluation circuit operable to determine the value of the data from the amount of provided charge, wherein the evaluation circuit is operable to compare the amount of charge to a reference value to determine the value of the data.

18. The read circuit of claim 17 wherein the charge circuit is operable to generate a predetermined voltage level across the storage unit by providing the amount of charge to the storage unit.

19. A memory, comprising:

a bit line;

a ferroelectric storage cell coupled to the bit line and operable to store data;

a charger coupled to the bit line and operable to generate a predetermined voltage across the storage cell by causing an amount of charge to flow into the storage cell; and a reader coupled to the bit line and operable to read the stored data based on the amount of charge that flows into the storage cell, wherein the bit line has a capacitance and the charger is further operable to charge the capacitance of the bit line before the amount of charge flows into the storage cell.

20. A memory, comprising:

a bit line;

a ferroelectric storage cell coupled to the bit line and operable to store data;

a charger coupled to the bit line and operable to generate a predetermined voltage across the storage cell by causing an amount of charge to flow into the storage cell; and a reader coupled to the bit line and operable to read the stored data based on the amount of charge that flows into the storage cell, wherein the charger is operable to receive a supply voltage and the predetermined voltage is less than the supply voltage.

21. A memory, comprising:

a bit line;

a ferroelectric storage cell coupled to the bit line and operable to store data;

a charger coupled to the bit line and operable to generate a predetermined voltage across the storage cell by causing an amount of charge to flow into the storage cell;

a reader coupled to the bit line and operable to read the stored data based on the amount of charge that flows into the storage cell; and a determinator coupled to the bit line and to the reader and operable to determine the amount of charge that flows into the storage cell.

22. A memory, comprising:
a bit line;
a ferroelectric storage cell coupled to the bit line and operable to store data;
a charger coupled to the bit line and operable to generate a predetermined voltage across the storage cell by causing an amount of charge to flow into the storage cell;
a reader coupled to the bit line and operable to read the stored data based on the amount of charge that flows into the storage cell;
a current mirror coupled to the charger; and
an integrator coupled to the current mirror and to the reader and operable to generate a signal that indicates to the reader the amount of charge that flows into the storage cell.

23. A memory, comprising:
a bit line;
a ferroelectric storage cell coupled to the bit line and operable to store data;
a charger coupled to the bit line and operable to generate a predetermined voltage across the storage cell by causing an amount of charge to flow into the storage cell;
a reader coupled to the bit line and operable to read the stored data based on the amount of charge that flows into the storage cell;
a current mirror coupled to the charger;
an integrator coupled to the current mirror and to the reader and operable to generate a signal level that indicates to the reader the amount of charge that flows into the storage cell; and
wherein the reader is operable to read the data by comparing the signal level to a predetermined reference level.

24. A method, comprising:
charging a data-storage cell with a first amount of charge;
reading data stored in the cell based on the first amount of charge;
generating a signal level that is proportional to the first amount of charge; and
wherein reading the data comprises comparing the signal level to a reference level.

25. The method of claim 24 wherein charging the data-storage cell comprises charging the data-storage cell to a predetermined voltage level.

26. The method of claim 24 wherein the data-storage cell comprises a ferroelectric cell.

27. A method, comprising:
charging a data-storage cell with a first amount of charge;
reading data stored in the cell based on the first amount of charge;
charging a capacitor with a second amount of charge that is proportional to the first amount of charge; and
wherein reading the data comprises comparing a voltage across the capacitor to a reference voltage.

28. A method, comprising:
charging a data-storage cell with a first amount of charge; and
reading data stored in the cell based on the first amount of charge;
wherein charging the data-storage cell comprises coupling a charge current to the cell;
mirroring the charge current;
coupling the mirrored charge current to a capacitor to charge the capacitor with a second amount of charge; and
wherein reading the data comprises comparing a voltage across the capacitor to a reference voltage.

* * * * *